United States Patent
Fushie et al.

(10) Patent No.: US 9,123,855 B2
(45) Date of Patent: Sep. 1, 2015

(54) MANUFACTURING METHOD OF ELECTRON MULTIPLIER SUBSTRATE, MANUFACTURING METHOD OF ELECTRON MULTIPLIER AND MANUFACTURING METHOD OF RADIATION DETECTOR

(75) Inventors: Takashi Fushie, Shinjuku-ku (JP); Hajime Kikuchi, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 13 days.

(21) Appl. No.: 13/990,496

(22) PCT Filed: Nov. 22, 2011

(86) PCT No.: PCT/JP2011/076904
§ 371 (c)(1),
(2), (4) Date: Jun. 24, 2013

(87) PCT Pub. No.: WO2012/073758
PCT Pub. Date: Jun. 7, 2012

(65) Prior Publication Data
US 2013/0267056 A1  Oct. 10, 2013

(30) Foreign Application Priority Data
Dec. 1, 2010 (JP) .................................. 2010-268852

(51) Int. Cl.
H01L 21/00 (2006.01)
H01L 31/115 (2006.01)
H01J 43/24 (2006.01)

(52) U.S. Cl.
CPC ............. *H01L 31/115* (2013.01); *H01J 43/246* (2013.01)

(58) Field of Classification Search
None
See application file for complete search history.

(56) References Cited

U.S. PATENT DOCUMENTS

| | | | |
|---|---|---|---|
| 5,742,061 A | | 4/1998 | Lemonnier et al. |
| 2002/0115016 A1* | | 8/2002 | Warren .......................... 430/259 |
| 2005/0045827 A1 | | 3/2005 | Katagiri et al. |
| 2006/0011854 A1 | | 1/2006 | Katagiri |
| 2009/0084972 A1 | | 4/2009 | Tamagawa et al. |
| 2011/0089042 A1 | | 4/2011 | De Oliveira et al. |

FOREIGN PATENT DOCUMENTS

| | | |
|---|---|---|
| JP | 2005-077235 A | 3/2005 |
| JP | 2005-200461 A | 7/2005 |
| JP | 2005-300479 A | 10/2005 |
| JP | 2006-302844 A | 11/2006 |
| JP | 2007-234485 A | 9/2007 |
| JP | 2009-301904 A | 12/2009 |
| WO | 96/17373 A1 | 6/1996 |
| WO | 2006/115249 A1 | 11/2006 |
| WO | 2009/127220 A1 | 10/2009 |

\* cited by examiner

Primary Examiner — Julio J Maldonado
Assistant Examiner — Robert Bachner
(74) Attorney, Agent, or Firm — Sughrue Mion, PLLC

(57) ABSTRACT

An underlayer is formed on a side wall 101a of a through hole 101 out of the side wall 101a of the through hole 101 and a substrate main surface, with a main surface having a low adhesion to a conductive layer disposed as an upper surface, and the conductive layer is formed on the substrate main surface and the side wall 101a of the through hole 101 on which the underlayer is formed, and the underlayer formed on the side wall 101a of the through hole 101 is selectively etched.

15 Claims, 13 Drawing Sheets

MANUFACTURING METHOD OF ELECTRON MULTIPLIER SUBSTRATE, MANUFACTURING METHOD OF ELECTRON MULTIPLIER AND MANUFACTURING METHOD OF RADIATION DETECTOR

CROSS REFERENCE TO RELATED APPLICATIONS

This application is a National Stage of International Application No. PCT/JP2011/076904 filed Nov. 22, 2011, claiming priority based on Japanese Patent Application No. 2010-268852, filed Dec. 1, 2010, the contents of all of which are incorporated herein by reference in their entirety.

TECHNICAL FIELD

The present invention relates to an electron multiplier for detecting a radiation by amplifying an electron in avalanche in a gas, and more specifically relates to a manufacturing method of an electron multiplier substrate used for the electron amplifier, a manufacturing method of an electron amplifier and a manufacturing method of a radiation detector.

DESCRIPTION OF RELATED ART

Conventionally, a gas electron multiplier (abbreviated as GEM) for detecting an ionizing radiation such as charged particles, gamma rays, X-rays, ultraviolet radiation, or a neutron, etc., is used. These detecting devices are configured to detect the radiation by performing electronic amplification by a gas electron amplifier using an electron avalanche effect, when the radiation to be detected enters into a chamber.

In recent years, a technique of using the neutron has been particularly focused in various fields. For example, the technique of using the neutron is utilized in various fields such as a structure analysis and a functional approach regarding a substance, and a structure analysis and a functional approach regarding a surface or an interface of the substance, or the state of the substance such as a liquid, amorphous, glass, or a high temperature superconductor, etc., or in a field of contributing to an innovative drug development by a hydrogen/hydration structure analysis of a biopolymer, and also in a field of a moving state of atoms or molecules in the substance and the functional approach thereof.

After the neutron is generated, the neutron is required to collide with the substance being an analysis object. Therefore, a neutron detector is also required together with a neutron generator. This is because a position where the neutron is collided and a flying time of the neutron can be judged by the neutron detector. Based on a desired position and flying time judged by the neutron detector, the structure analysis is performed to the substance which is the analysis object.

As the neutron detector used here, a detector as an electron amplifier substrate, is known, using a plate-shaped member (polymer film) made of polyimide and on which a plurality of through holes are formed, with both sides coated with copper (for example, see patent document 1). In this type of detector, the electrons are amplified in the gas in avalanche by making the neutron brought into contact with the gas in the device so that the electron is detected, to thereby judge the position where the neutron is collided and also judge the flying time or the neutron.

Meanwhile, there is also other detector configured to make the neutron brought into contact with a scintillator, and transmit a scintillation light generated thereby to a wavelength conversion fiber. Then, the position where the neutron is collided, and the flying time of the neutron are judged by converting the transmitted light to an electron by a photomultiplier and detecting the converted electron. (For example, see patent documents 2 to 4)

PRIOR ART DOCUMENT

Patent Document

Patent Document 1:
Japanese Patent Laid Open Publication No. 2006-302844
Patent Document 2:
Japanese Patent Laid Open Publication No. 2005-077235
Patent Document 3:
Japanese Patent Laid Open Publication No. 2005-200461
Patent Document 4:
Japanese Patent Laid Open Publication No. 2005-300479

SUMMARY OF THE INVENTION

Problem to be solved by the Invention

GEM disclosed in patent document 1 is used for detecting X-rays. However, in order to detect the neutron by GEM, a high vacuum state is required, compared with a case that the X-rays are detected. Further, in order to efficiently amplify the electrons in avalanche, a plurality of plate-shaped members made of polyimide, etc., are required to be disposed at a specific gap provided between them. However, since the plate-shaped member made of polyimide, etc., is a polymer film, distortion is generated when a high vacuum state is created, thus involving a problem that the gap cannot be maintained, and the neutron cannot be accurately detected.

Further, in a case of an organic film such as a polymer film, there is also a problem that the electron avalanche is inhibited by outgas, and therefore the neutron cannot be detected.

Further, the detector for the neutron configured as a combination of a scintillator and an optical fiber described in patent documents 2 to 4, involves a problem that the device is expensive, and a detection of the neutron is extremely inefficient, because the detection efficiency of the neutron is about 50%.

Therefore, in order to solve the above-described problems, the present invention is provided, and an object of the present invention is to provide a manufacturing method of an electron amplifier substrate, and a manufacturing method of the electron amplifier and a manufacturing method of a radiation detector, capable of realizing a high radiation detection efficiency at a low cost.

Means for solving the Problem

According to a first aspect of the present invention, there is provided a manufacturing method of an electron amplifier substrate, which is the manufacturing method of a substrate used for a radiation detector that performs detection of a radiation by amplifying an electron in a gas, being an electron amplifier substrate with a conductive layer and a through hole formed thereon, the conductive layer having a layer adhered to a substrate main surface, the method comprising:

forming an underlayer on a side wall of the through hole out of the side wall of the through hole and the substrate main surface, with a main surface set as an upper surface where adhesion to the conductive layer is low;

forming the conductive layer on the substrate main surface and on the side wall of the through hole where the underlayer is formed; and selectively etching the underlayer formed on the side wall of the through hole.

According to a second aspect of the present invention, there is provided the method of the first aspect, wherein the substrate is a photosensitive glass substrate, and the through hole is formed by irradiation of a ultraviolet ray.

According to a third aspect of the present invention, there is provided the method of the first aspect or the second aspect, wherein the substrate has front/back surfaces, and the conductive layer is formed on the front/back surfaces of the substrate.

According to a fourth aspect of the present invention, there is provided the method of any one of the first to third aspects, wherein a plurality of through holes are formed, each of them having a circular shape in a plan view, and formed on the substrate at a specific interval.

According to a fifth aspect of the present invention, there is provided the method of any one of the first to fourth aspects, wherein an etching time required for the etching step is set in a period until the conductive layer formed on the underlayer formed on the side wall of the through hole is fractured and then removed, together with the underlayer.

According to a sixth aspect of the present invention, there is provided the method of any one of the first to fifth aspects, wherein the underlayer is made of chromium, and by oxidizing the main surface, adhesion to the conductive layer is set to be low, and an etching rate for a layer adhered to the conductive layer of the main surface of the substrate is set to be high.

According to a seventh aspect of the present invention, there is provided the method of any one of the first to sixth aspects, wherein the conductive layer includes an adhesive layer adhered to the substrate, and a metal layer formed so as to cover the adhesive layer.

According to an eighth aspect of the present invention, there is provided the method of any one of the first to seventh aspects, wherein the adhesive layer is made of chromium, and the metal layer is made of copper, and the adhesive layer and the metal layer are continuously formed.

According to a ninth aspect of the present invention, there is provided a manufacturing method of an electron amplifier substrate, for manufacturing an electron amplifier substrate in which a conductive layer is formed having a layer adhered to a substrate made of a photosensitive glass, with a through hole formed by irradiation of ultraviolet rays, the method comprising:

forming an underlayer composed of a chromium oxide layer with an oxidized main surface as an upper surface, on a side wall of the through hole out of the side wall of the through hole and the substrate main surface;

forming a chromium layer on the side wall of the through hole on which the underlayer is formed, and on the substrate main surface, and forming a copper layer so as to cover the chromium layer continuously; and performing etching in an etching time set in a period until the conductive layer formed on the underlayer formed on the side wall of the through hole is fractured and removed together with the underlayer, wherein a plurality of through holes are formed, each of them having a circular shape in a plan view, and formed on the substrate at a specific interval.

According to a tenth aspect of the present invention, there is provided a manufacturing method of an electron amplifier, wherein the electron amplifier substrate manufactured by the method of any one of the first to ninth aspects, is used.

According to an eleventh aspect of the present invention, there is provided a manufacturing method of a radiation detector, wherein the manufactured electron amplifier substrate of any one of the first to ninth aspects, is used.

Advantage of the Invention

According to the present invention, a high radiation detection efficiency can be realized at a low cost.

DETAILED DESCRIPTION OF THE INVENTION

Embodiments of the present invention will be described hereafter, using the drawings.

The present invention is applied to a radiation detector that performs electron amplification by an electron avalanche effect using a gas electron amplifier (simply called an electron amplifier), and detects a radiation such as an ionizing radiation including charged particles, alpha rays, beta rays, gamma rays, X-rays, ultraviolet radiation, or neutron, and such as a non-ionizing radiation including near-ultraviolet rays and visible rays. In order to solve the above-mentioned problem, a photosensitive glass is used instead of a polymer film as a substrate of the electron amplifier substrate used for the electron amplifier of the radiation detector.

<Regarding Photosensitive Glass>

The photosensitive glass used as the substrate of the electron amplifier substrate, will be described. The photosensitive glass has extremely excellent processability, because it can be processed by wet etching at a low cost. Further, unlike the polymer film, even in a state of a high vacuum state, the distortion is not generated and a gap can be maintained. Therefore, the photosensitive glass is extremely effective as the substrate of the electron amplifier substrate used for the electron amplifier of the radiation detector for detecting the radiation as describe above.

<Regarding Electron Amplifier Substrate>

Subsequently, explanation is given for the electron amplifier substrate using the photosensitive glass as the substrate for generating an electron amplification by an electron avalanche effect in the electron amplifier. In order to generate the electron amplification by the electron avalanche effect in the electron amplifier, a plurality of through holes are required to be formed on the photosensitive glass.

Figure 1:
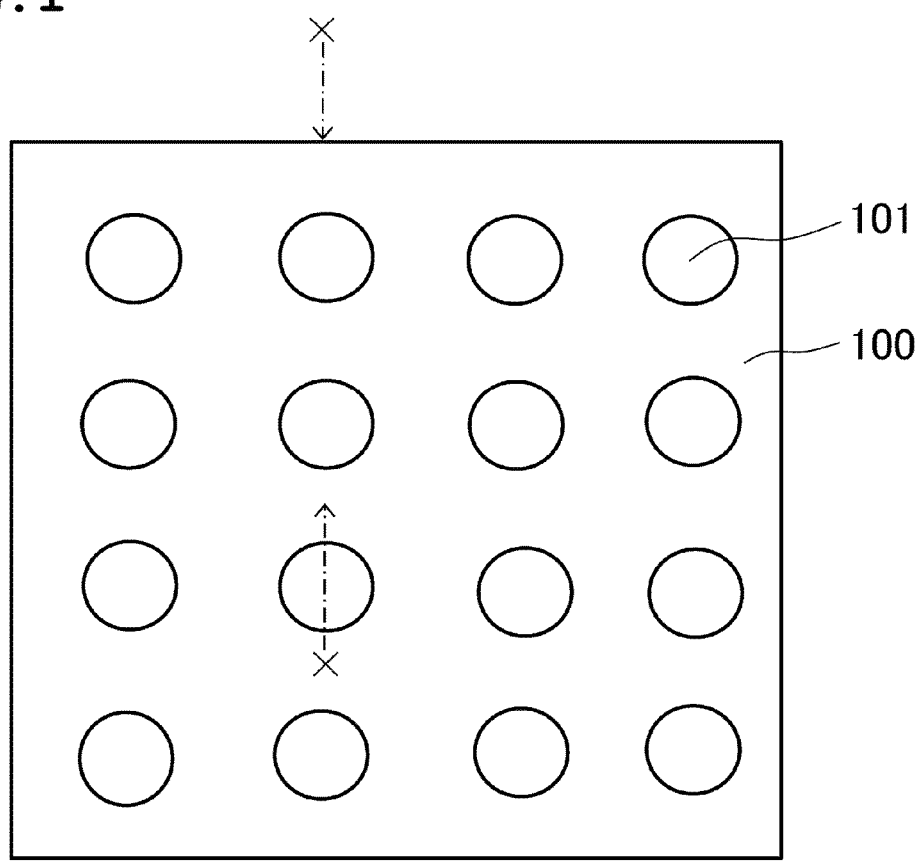
FIG. 1 is a view showing a substrate made of a photosensitive glass used for an electron amplifier substrate.

As shown in FIG. 1, each of the plurality of through holes 101 formed on a substrate 100 being the photosensitive glass has a circular shape in a plan view, and is formed at a specific interval.

Figure 2:
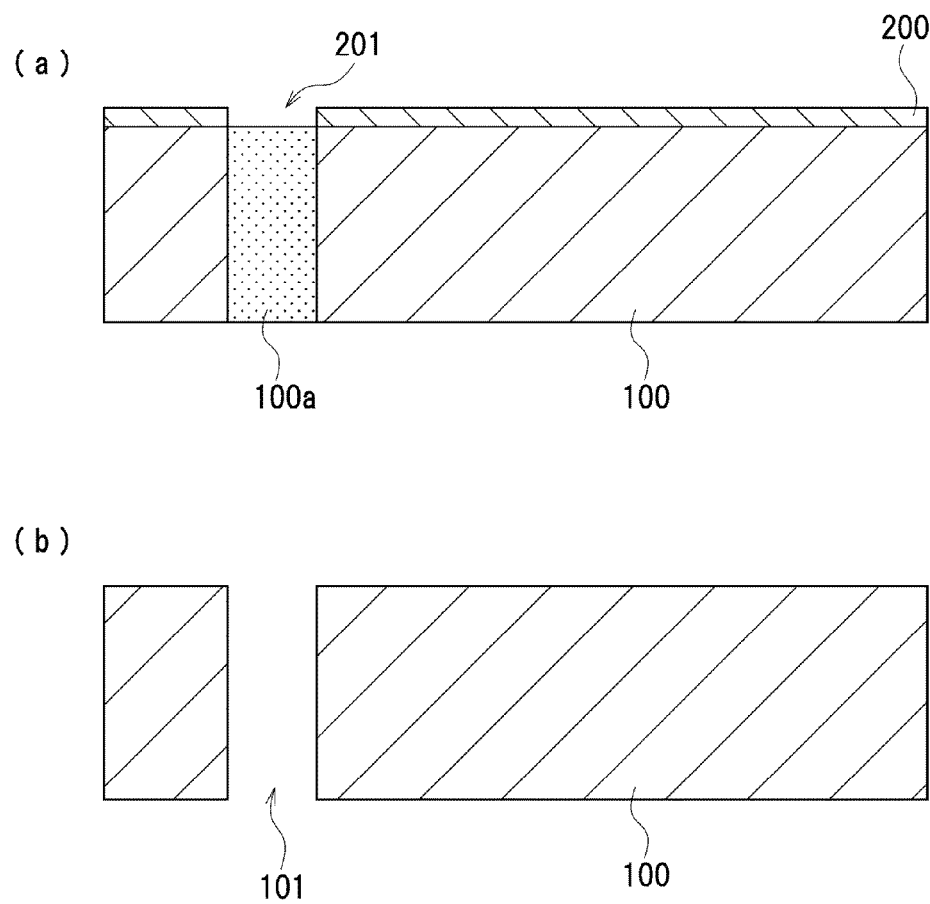
FIG. 2 is a view showing a step of forming a through hole on the substrate made of the photosensitive glass.

Next, explanation is given for a process of forming the through hole on the substrate 100 being the photosensitive glass, using FIG. 2. First, as shown in FIG. 2(a), a photomask 200 is set on an upper side of one main surface of the substrate 100. In the photomask 200, only a through hole formation part 201 formed on the substrate 100 is opened.

When the ultraviolet rays are emitted from the photomask 200 side after setting the photomask 200, the substrate 100 of the through hole formation part 201 is selectively irradiated with the ultraviolet rays. Thus, an exposure part 100a being a crystallized portion as shown in FIG. 2(a), is formed on the substrate 100.

Subsequently, the substrate 100 with the exposure part 100a formed thereon, is placed in an electric furnace, etc., and heat treatment is applied thereto, to thereby crystallize the exposure part 100a. In the substrate 100 thus processed by applying the heat treatment thereto, only the exposure part 100a can be etched out by being immersed into dilute hydrofluoric acid. Thus, as shown in FIG. 2(b), only the exposure part 100a can be selectively dissolved and removed, and therefore a through hole 101 is formed on the substrate 100.

Figure 3:
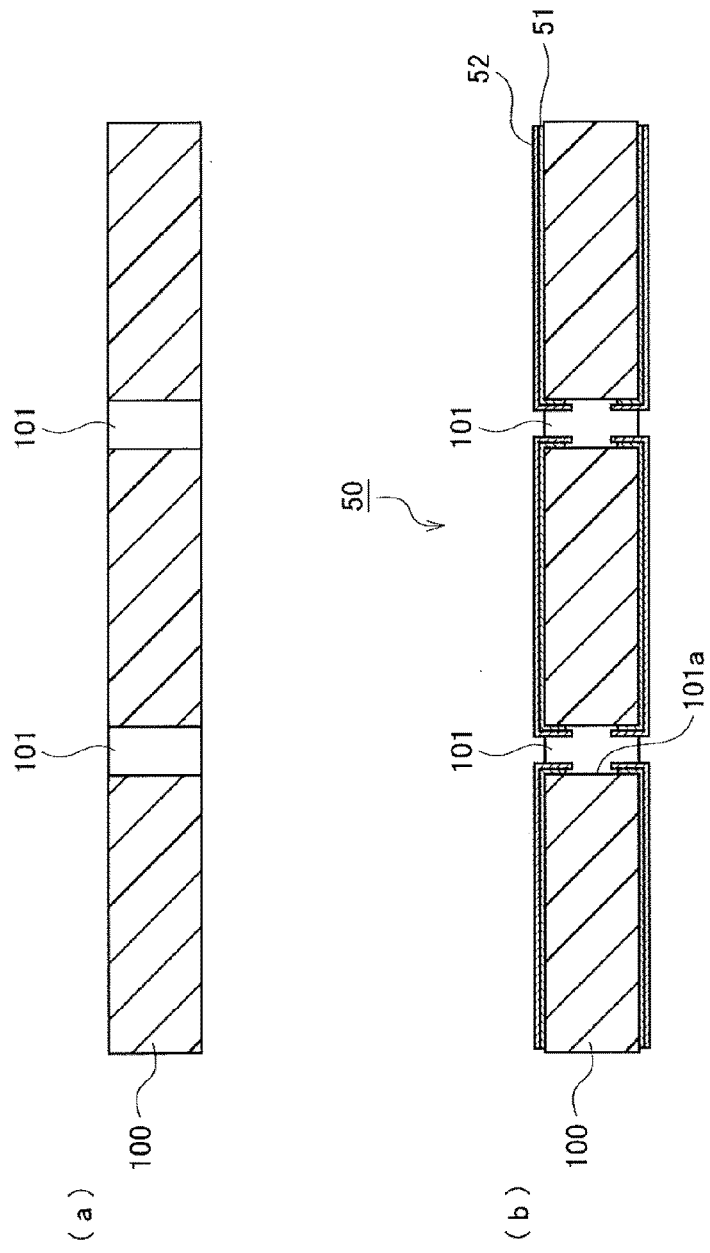
FIG. 3 is a view showing a step of manufacturing the electron amplifier substrate by forming a metal film on the substrate on which the through hole is formed.
Figure 4:
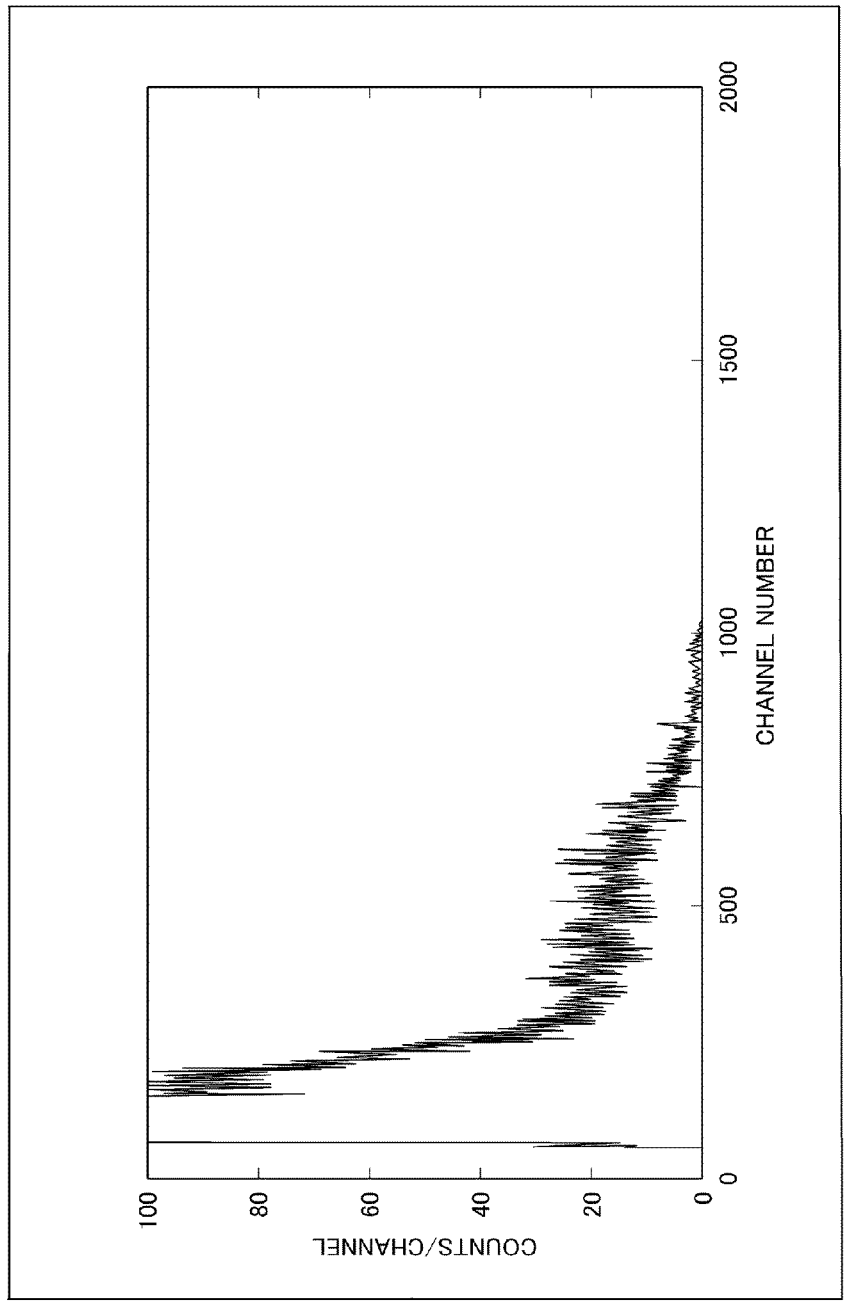
FIG. 4 is a view showing a detection result of a neutron.

Next, explanation is given for a formation process of the electron amplifier substrate using the substrate 100 being the photosensitive glass, using FIG. 3. FIG. 3(a) and FIG. 3(b) are cross-sectional views showing a state of the substrate 100 of FIG. 1 taken along the line X-X. A chromium layer 51 and a copper layer 52 are formed by chromium and copper continuous-sputtering as shown in FIG. 3(b) onto the front/back surfaces of the substrate 100 having a plurality of through holes 101 formed thereon as shown in FIG. 3(a). Thus, an electron amplifier substrate 50 as shown in FIG. 3(b) is formed.

Note that since the adhesion is low between the copper layer 52 being the conductive layer and the substrate 100 being the photosensitive glass, the chromium layer 51 being an adhesive layer made of chromium having a high adhesion to the substrate 100 and the copper layer 52, is required to be formed. When the conductive layer is formed by a metal having a high adhesion to the substrate 100, the adhesive layer may not be necessarily formed.

As shown in FIG. 3(b), the side wall 101a of the through hole 101 of the electron amplifier substrate 50 is set in a state that the chromium layer 51 and the copper layer 52 are formed by sputtering. When the radiation detector is formed for detecting the neutron for example out of the above-mentioned radiations by the electron amplifier using the above-mentioned electron amplifier substrate 50, it is found that a desired neutron cannot be detected, even with a sufficient electron amplification factor.

As a result of strenuous efforts by inventors of the present invention, it is found that a desired radiation cannot be detected, because the chromium layer 51 and the copper layer 52 are formed on the side wall 101a of a plurality of through holes 101 of the electron amplifier substrate 50 shown in FIG. 3(b).

Therefore, the inventors of the present invention achieve a technique of manufacturing an electron amplifier substrate in a state that the chromium layer 51 and the copper layer 52 are not formed on the side wall 101a of the through hole 101 of the substrate 100. The method will be described hereafter.

Figure 5:
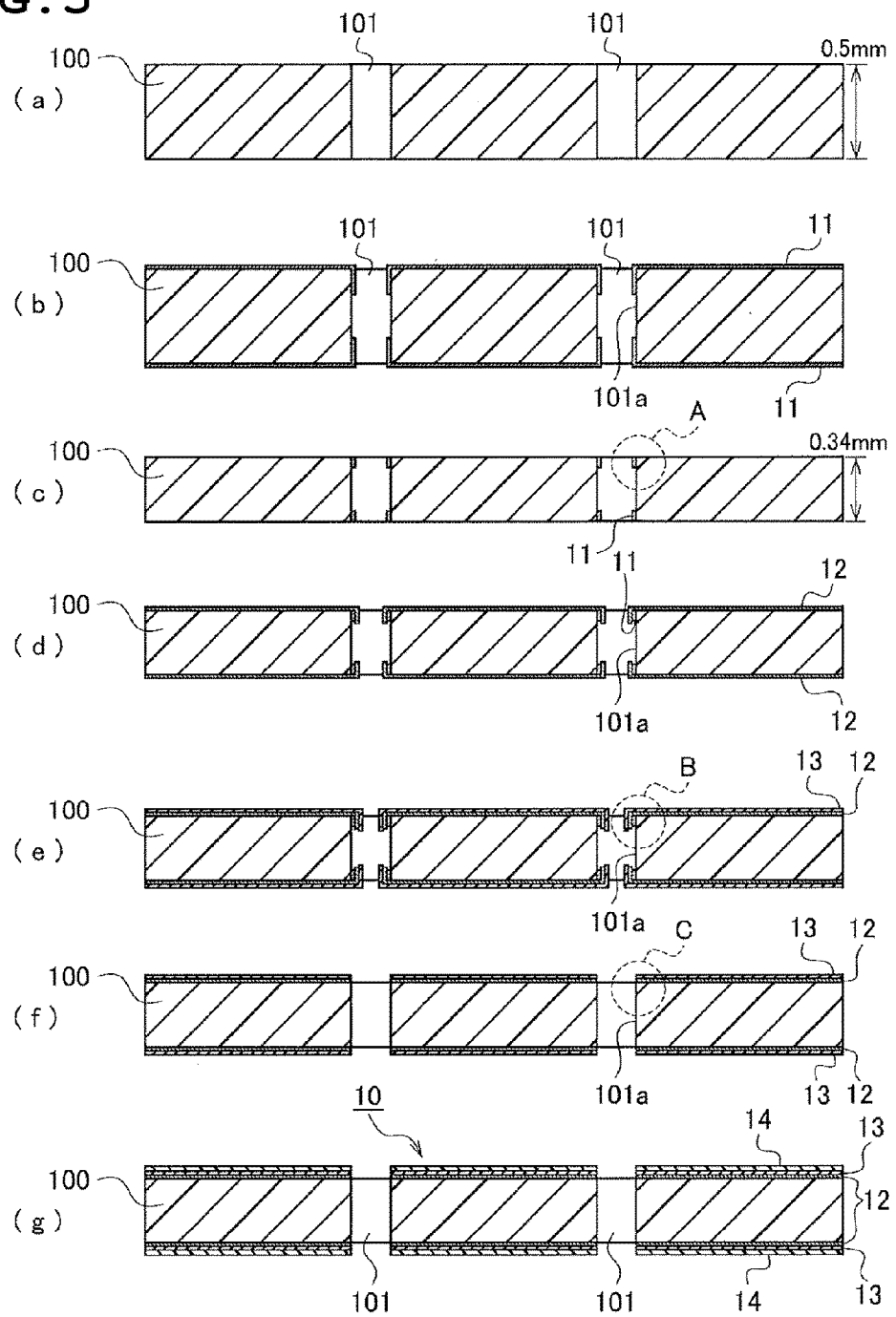
FIG. 5 is a view showing a manufacturing method of an electron amplifier substrate according to a first embodiment of the present invention.

Regarding the Manufacturing Method of an Electron Amplifier Substrate of the Present Invention First Embodiment Formation of the Underlayer, and the Manufacturing Method by Polishing Removal of the Substrate Front/Back Surfaces Explanation is given for the manufacturing method of an electron amplifier substrate according to a first embodiment of the present invention, using FIG. 5. FIG. 5(a) to FIG. 5(g) are cross-sectional views showing a state of the substrate 100 of FIG. 1 taken along the line X-X.

First, the substrate 100 made of the photosensitive glass with a plurality of through holes 101 formed thereon as shown in FIG. 5(a), is prepared. At this time, a thickness of the substrate 100 is about 0.5 mm.

Subsequently, as shown in FIG. 5(b), a chromium layer 11 is formed by sputtering chromium onto the front/back surfaces of the substrate 100. The thickness of the chromium layer 11 is about 1000 Å. As shown in FIG. 5(b), the chromium layer 11 is also formed on the side wall 101a of the through hole 101. The chromium layer 11 is called the underlayer.

Figure 6:
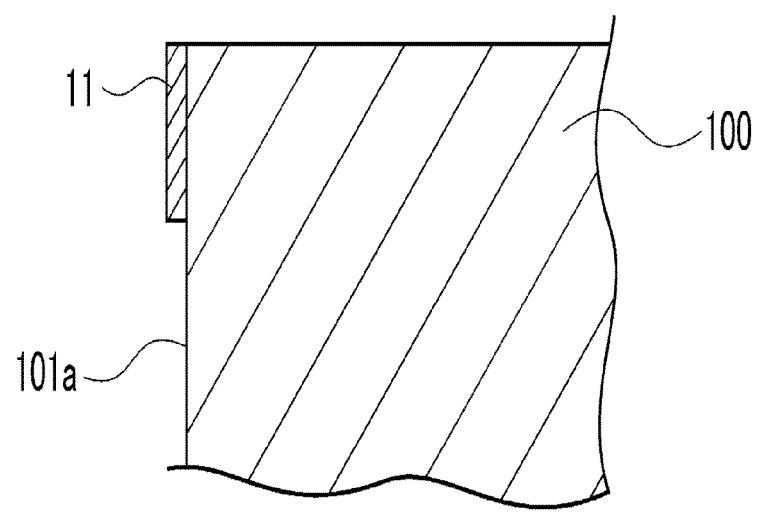
FIG. 6 is a view showing a state that a chromium layer is formed on a side wall of the through hole as an underlayer.

Next, as shown in FIG. 5(c), the front/back surfaces of the substrate 100 with the chromium layer 11 formed thereon, are polished. Thus, only the chromium layer 11 formed on the front/back surfaces of the substrate 100 is removed. FIG. 6 shows an expanded state of the area A of FIG. 5(c). As shown in FIG. 6, only the chromium layer 11 formed on the side wall 101 of the through hole 101 of the substrate 100, is not removed and remained. The thickness of the substrate 100 becomes about 0.34 mm by polishing.

Further, as shown in FIG. 5(b), the chromium layer 12 is formed by sputtering the chromium again onto the front/back surfaces of the substrate 100. The thickness of the chromium layer 12 is about 500 Å. In this embodiment, in a stage before the chromium layer 12 is formed, the substrate 100 is exposed to an oxygen atmosphere, to thereby oxidize the surface of the chromium layer 11 formed on the side wall 101a of the through hole 101. Thus, the main surface of the chromium layer 11 being the underlayer, becomes a chromium oxide layer. A step of oxidizing the main surface of the chromium layer 11 may be executed any time, in a period from formation of the chromium layer 11 to formation of the chromium layer 12.

Figure 7:
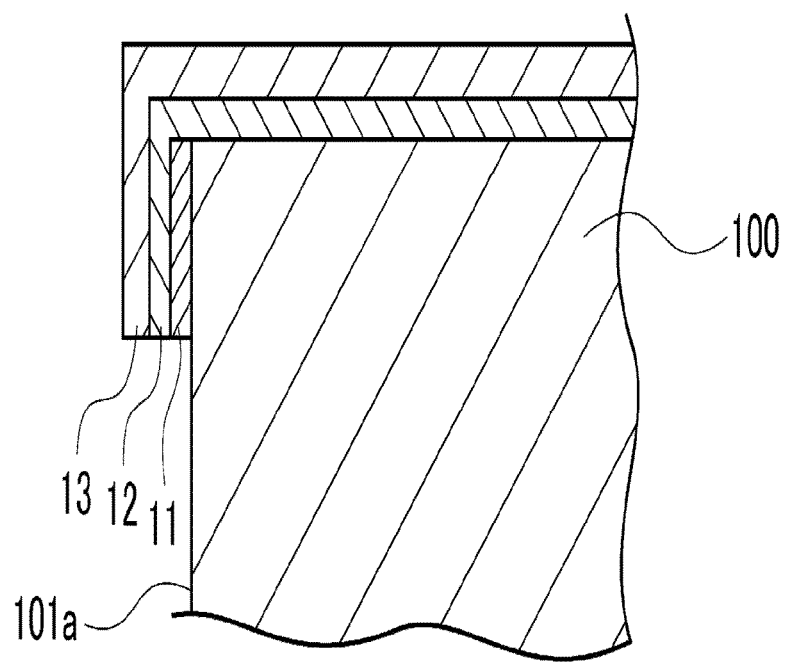
FIG. 7 is a view showing a state that a chromium layer with a main surface oxidized, a chromium layer, and a copper layer are formed on the side wall of the through hole.

As shown in FIG. 5(e), after the chromium layer 12 is formed by sputtering the chromium, copper is continuously sputtered onto the front/back surfaces of the substrate 100, to thereby form the copper layer 13. The thickness of the copper layer 13 is 600 Å. FIG. 7 shows an expanded state of area B of FIG. 5(e). As shown in FIG. 7, the chromium layer 11 not removed and remained with the main surface oxidized, the chromium layer 12, and the copper layer 13 are formed on the side wall 101a of the through hole 101 of the substrate 100. The chromium layer 11 has a low adhesion to the chromium layer 12 because the main surface is oxidized.

Figure 8:
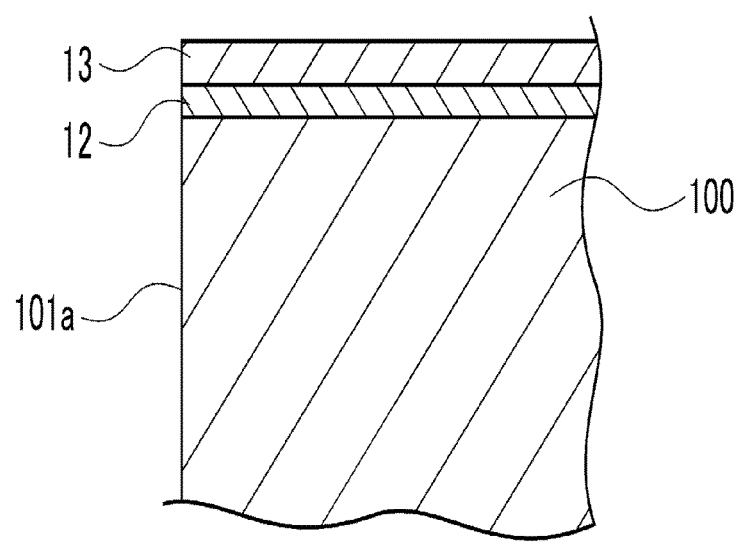
FIG. 8 is a view showing a state that the underlayer, etc., formed on the side wall of the through hole is removed.

Subsequently, the substrate 100 with the chromium layer 12 formed thereon, is subjected to wet etching using an etching solution (for example, potassium ferricyanide). Thus, as shown in FIG. 5(f), the chromium layer 11, the chromium layer 12, and the copper layer 13 formed on the side wall 101a of the through hole 101, are removed. FIG. 8 shows a state that area C of FIG. 5(f) is expanded. As shown in FIG. 8, the chromium layer 11, the chromium layer 12, and the copper layer 13 formed on the side wall 101a of the through hole 101, are fractured and removed so as to leave only the chromium layer 12 and the copper layer 13 formed on the surface of the substrate 100. The same thing can be said for the back surface of the substrate 100.

It is also effective to perform dry etching instead of wet etching, because the through hole 101 of the substrate 100 is the most easily attacked.

This is a phenomenon generated by selective etching applied to the chromium layer 11 formed on the side wall 101a of the through hole 101, due to a fast etching rate for the chromium layer 11 with the chromium oxide layer formed on the main surface, compared with the etching rate for the chromium layer 12. Further, the adhesion is extremely poor between the chromium layer 11 with the main surface set as the chromium oxide layer, and the chromium layer 12, and therefore the etching solution is easily permeated between the chromium layer 11 and the chromium layer 12.

When the chromium layer 11 with the main surface oxidized, is selectively etched, the chromium layer 12 and the copper layer 13 formed on the chromium layer 11, becomes dynamically unstable, and are fractured.

Finally, as shown in FIG. 5(g), the electron amplifier substrate 10 of the present invention is formed by forming an electric copper plating layer 14 by applying electric copper plating onto the chromium layer and the copper layer 13 formed on the front/back surfaces of the substrate 100.

The electron amplifier substrate 10 thus formed, is capable of detecting the radiation satisfactorily, when being utilized for the radiation detector which is applied to the electron amplifier. Particularly, by employing the photosensitive glass for the substrate 100, the radiation can be detected satisfactorily using the electron amplifier substrate 10 using an inexpensive material, which is difficult by a polymer film.

Example

Figure 9:
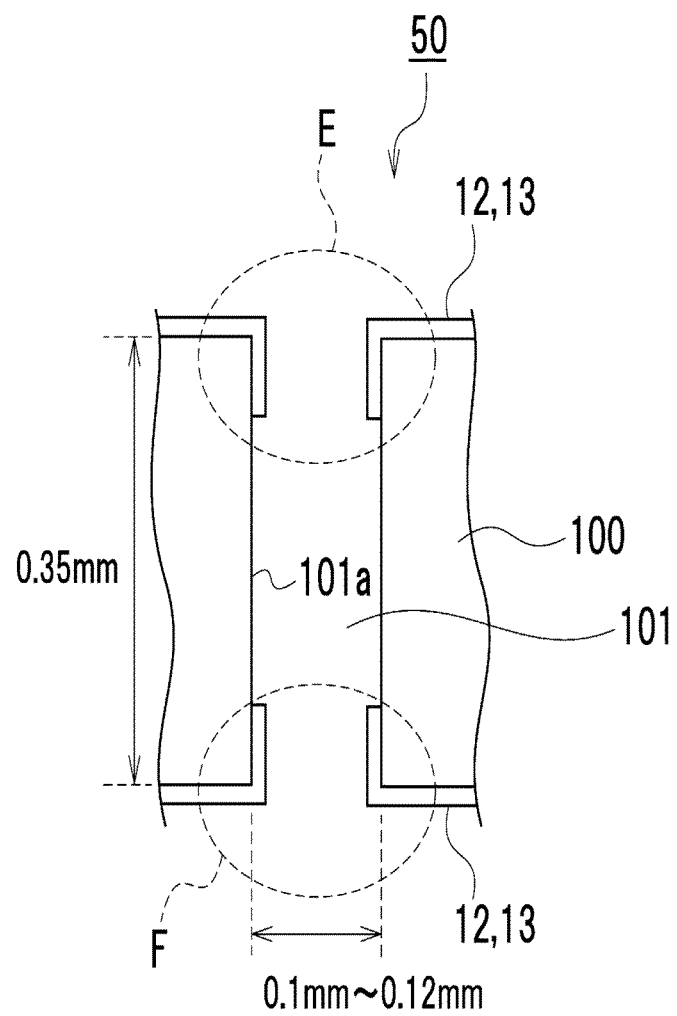
FIG. 9 is a view showing a state that the chromium layer and the copper layer are already formed on the side wall of the through hole.
Figure 10:
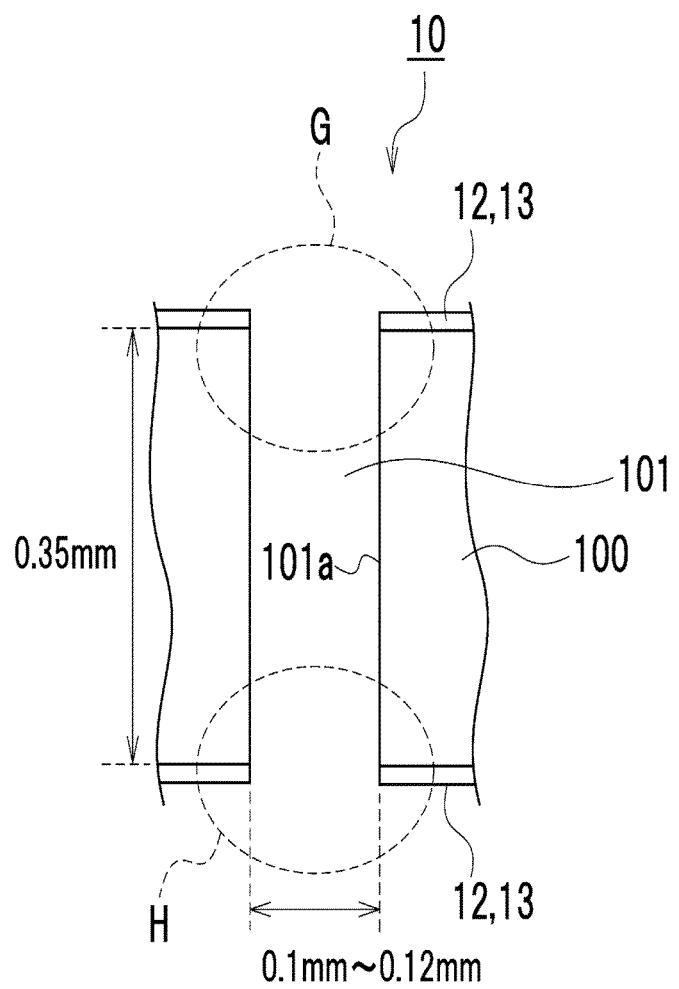
FIG. 10 is a view showing a state that the chromium layer and the copper layer formed on the side wall of the through hole, are removed.

Here, FIG. 9 and FIG. 10 show a partial cross-sectional view of the electron amplifier substrate 50 fabricated by not using the manufacturing method of the present invention, and a cross-sectional view of the electron amplifier substrate 10 fabricated by using the manufacturing method of the present invention, on the substrate 100 being the photosensitive glass. Note that FIG. 9 and FIG. 10 show the stage before the electric copper plating layer 14 is formed.

As shown in FIG. 9, it is found that on the electron amplifier substrate 50, the chromium layer 12 and the chromium layer 13 being metal layers are formed as shown in areas E and F, on the side wall 101a of the through hole 101. The thickness of the substrate 100 at this time is set to about 0.35 mm, and a diameter of the through hole 101 is set to about 0.1 to 0.12 mm.

As shown in FIG. 10, on the electron amplifier substrate 10, it is found that the chromium layer 12 and the copper layer 13 being the metal layers are not formed and are completely removed as shown in areas G and H, on/from the side wall 101a of the through hole 101. The thickness of the substrate 100 is set to about 0.35 mm, and the diameter of the through hole 101 is set to about 0.1 to 0.12 mm.

Figure 11:
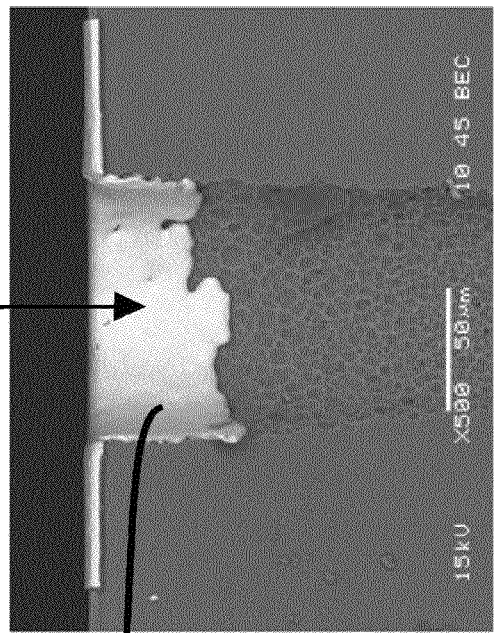
FIG. 11 is a photograph in which a state that the copper layer is formed on the side wall of the through hole, is photographed by a scanning electron microscope.
Figure 12:
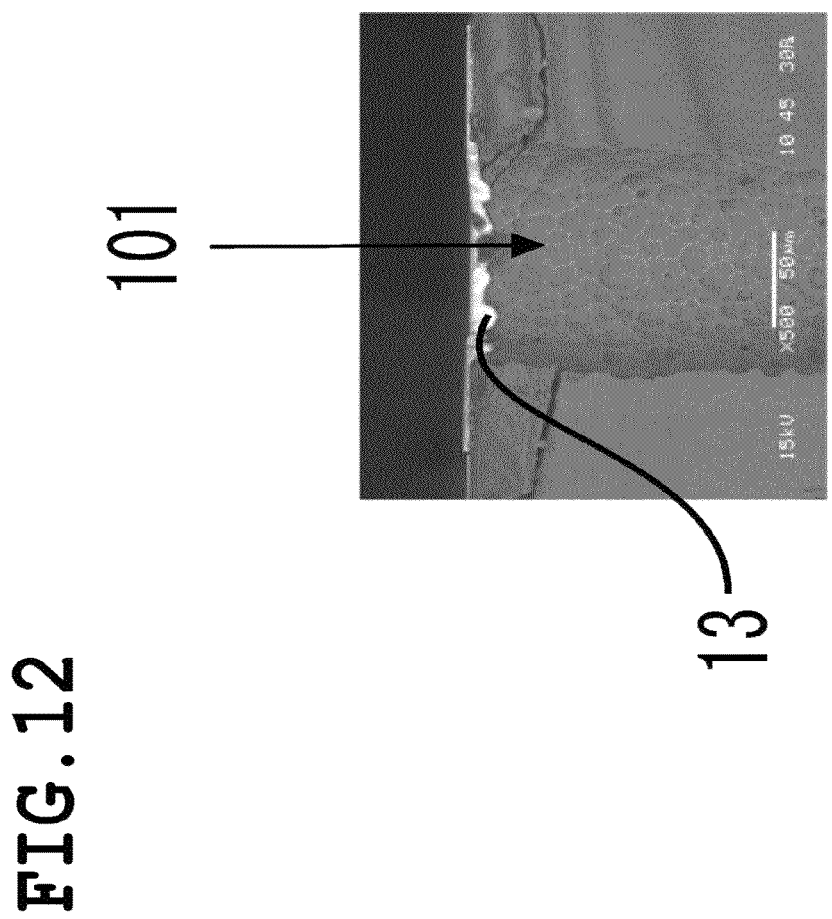
FIG. 12 is a photograph in which a state that the copper layer formed on the side wall of the through hole, is removed.

Further, FIG. 11 and FIG. 12 respectively show a photograph of partial cross-sectional views of the electron amplifier substrate 50 fabricated by not applying the manufacturing method of the present invention to the substrate 100 being the photosensitive glass, and the electron amplifier substrate 10 fabricated by applying the manufacturing method of the present invention to the substrate 10, which are cut at the through hole 101, photographed by the Scanning Electron Microscope (SEM). Further, results of an element analysis using an Energy Dispersive X-ray Spectrometer (EDS), performed at the side wall 101a of each through hole 101, are shown in table 1 and table 2.

It is found that the copper layer 13 being the metal layer is clearly remained as being formed on the side wall 101a of the through hole 101, on the electron amplifier substrate 50 as shown in FIG. 11. Table 1 shows the results of the EDS analysis as follows. Note that measurement parameters of the EDS are as follows.

(Measurement Parameters)
Accelerating voltage: 15.0 kV
Irradiation current: 0.66200 nA
Elapsed time: 123.87 seconds
Dead time: 19%
Effective time: 100.00 seconds
Counting rate: 3699 counts/second
Preset: Live time 100 seconds
Energy range: 0 to 20 KeV
PHA mode: T3
PRZ method: Simple quantitative analysis
Fitting coefficient: 0.1163

TABLE 1

| Element | (KeV) | Mass (%) | Error (%) | Atomic number (%) | K |
|---------|-------|----------|-----------|-------------------|---|
| C(K)    | 0.277 | 5.67     | 0.11      | 10.7              | 0.9863 |
| O(K)    | 0.525 | 33.96    | 0.09      | 48.16             | 35.4685 |
| Al(K)   | 1.486 | 3.00     | 0.08      | 2.52              | 2.6864 |
| Si(K)   | 1.739 | 38.73    | 0.09      | 2.52              | 2.6864 |
| K(K)    | 3.312 | 3.03     | 0.15      | 1.76              | 3.628 |
| Cr(K)   |       |          |           |                   |  |
| Cu(K)   | 8.04  | 15.61    | 1.26      | 5.58              | 16.4921 |
| Total   |       | 100.00   |           | 100.00            |  |

As shown in table 1, it is found that the number of copper atoms stuck to the side wall 101a of the through hole 101 of the substrate 100 is 5.58% and is extremely high.

As shown in FIG. 12, it is found that the copper layer 13 being the metal layer is completely removed from the side wall of the through hole 101, on the electron amplifier substrate 10. Table 2 shows the results of the EDS analysis. Note that the measurement parameters of the EDS are as follows.

(Measurement Parameters)
Accelerating voltage: 15.0 kV
Irradiation current: 0.66200 nA
Elapsed time: 128.58 seconds
Dead time: 22%
Effective time: 100.00 seconds
Counting rate: 4598 counts/second
Preset: Live time 100 seconds
Energy range: 0 to 20 KeV
PHA mode: T3
PRZ method: Simple quantitative analysis
Fitting coefficient: 0.1117

TABLE 2

| Element | (KeV) | Mass (%) | Error (%) | Atomic number (%) | K |
|---|---|---|---|---|---|
| C(K) | 0.277 | 10.41 | 0.1 | 17.3 | 1.9915 |
| O(K) | 0.525 | 39.53 | 0.09 | 49.3 | 43.1016 |
| Al(K) | 1.486 | 7.14 | 0.07 | 5.28 | 7.3655 |
| Si(K) | 1.739 | 35.39 | 0.08 | 25.14 | 39.1244 |
| K(K) | 3.312 | 3.1 | 0.15 | 1.58 | 3.7747 |
| Cr(K) | | | | | |
| Cu(K) | 8.04 | 4.44 | 1.26 | 1.39 | 4.6422 |
| Total | | 100.00 | | 100.00 | |

As shown in table 2, it is found that the number of copper atoms stuck to the side wall 101a of the through hole 101 of the substrate 100 is 1.39% and is extremely low.

Second Embodiment

Manufacturing Method by Mask Sputtering

Figure 13:
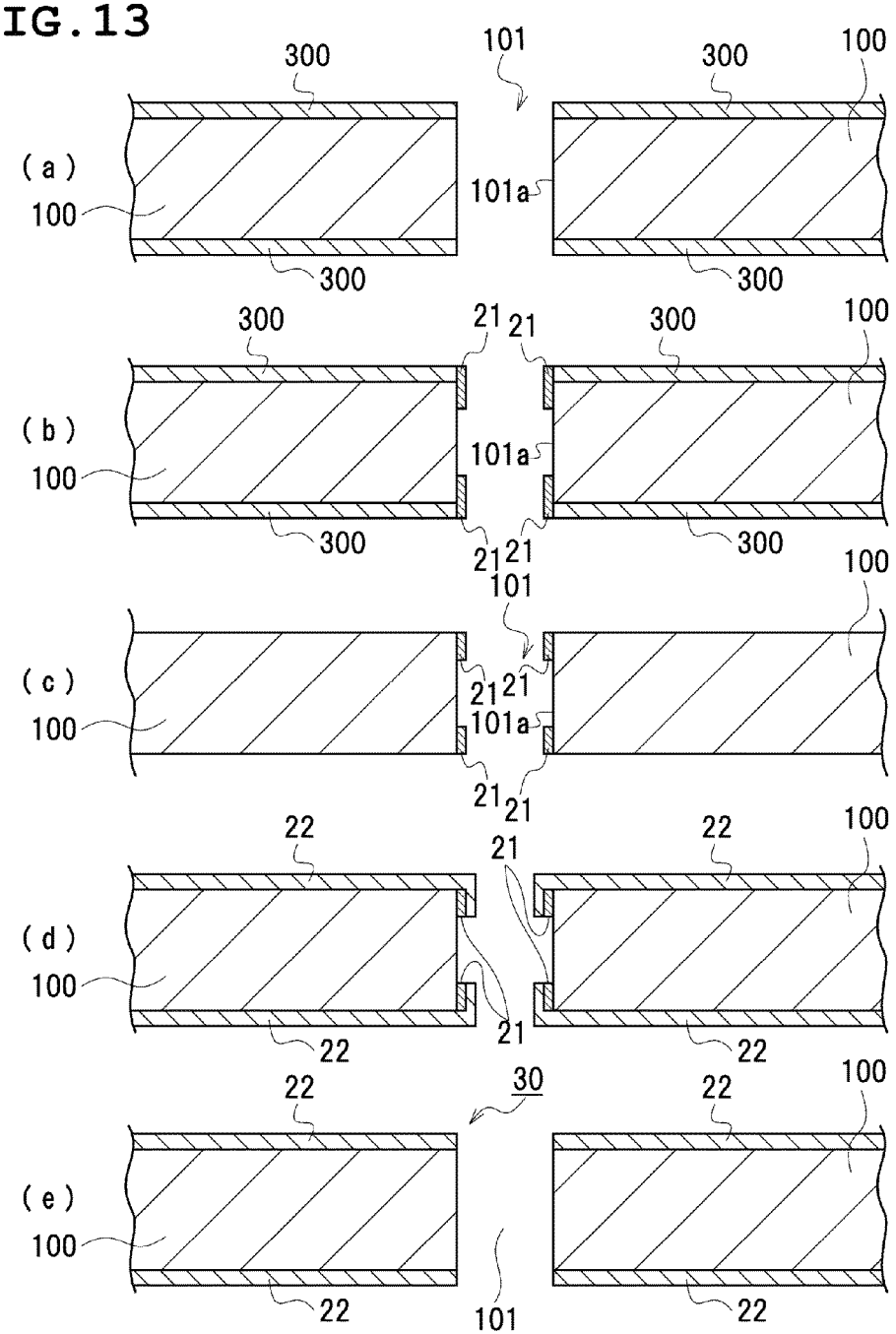
FIG. 13 is a view showing a manufacturing method of an electron amplifier substrate according to a second embodiment of the present invention.

Next, explanation is given for the manufacturing method of the electron amplifier substrate according to a second embodiment of the present invention, using FIG. 13.

The manufacturing method of the second embodiment is as follows. Namely, the underlayer is directly formed only on the side wall 101a of the through hole 101 of the substrate 100 using mask sputtering, and the metal layer is formed using the main surface oxidization treatment. Then the underlayer and the metal layer formed on the side wall 101a of the through hole 101 are removed by wet etching.

First, as shown in FIG. 13(a), the substrate 100 made of the photosensitive glass with the through hole 101 formed thereon, is prepared. As shown in FIG. 13(a), a metal mask 300, with a position of the through hole 101 opened, such as SUS (stainless), etc., is positioned on the front/back surfaces of the substrate 100 made of the photosensitive glass.

Next, as shown in FIG. 13(b), a chromium layer 21 is formed by sputtering the chromium onto the side wall 101a of the through hole 101 of the substrate 100. The chromium layer 21 is called the underlayer.

Next, as shown in FIG. 13(c), the mask 300 positioned on the front/back surfaces of the substrate 100 is removed. Thus, the chromium layer 21 is formed only on the side wall 101a of the through hole 101 of the substrate 100, as the underlayer.

Thus, the surface of the chromium layer 21 formed on the side wall 101a of the through hole 101 is oxidized by exposing the substrate 100 with the chromium layer formed thereon as the underlayer, to an oxygen atmosphere. Thus, the main surface of the chromium layer 21 being the underlayer becomes the chromium oxide layer.

As shown in FIG. 13(d), an ITO layer 22 is formed as the metal layer, by sputtering ITO (indium tin oxide) thereto, having a high adhesion to the substrate 100 being the photosensitive glass. However, the chromium layer 21 has a low adhesion to the ITO layer 22, because the main surface is oxidized.

Subsequently, the substrate 100 with the ITO layer 22 formed thereon, is subjected to wet etching. Thus, as shown in FIG. 13(e), the chromium layer 21 and the ITO layer 22 formed on the side wall 101a of the through hold 101, are removed. Thus, the electron amplifier substrate 30 of the present invention is formed. Note that it is also effective to perform dry etching instead of the wet etching, because the through hole 101 of the substrate 100 is the most easily attacked.

The electron amplifier substrate 30 thus formed, is capable of detecting the radiation satisfactorily, when being applied to the electron amplifier and utilized for the radiation detector. Particularly, by employing the photosensitive glass for the substrate 100, the radiation can be detected satisfactorily using the electron amplifier substrate 30 made of inexpensive material, which is difficult by a polymer film.

Further, when the electron amplifier substrate of the first embodiment is manufactured, a step of polishing of the chromium layer 11 formed on the front/back surfaces of the substrate 100, is required. However, when the electron amplifier substrate of the second embodiment is manufactured, such a polishing step can be omitted, and therefore the manufacturing step can be shortened.

<Regarding a Material Used for the Underlayer and the Metal Layer>

In the first embodiment, the chromium layer 11 is formed as the underlayer by sputtering chromium, and the copper layer 13 is formed as the conductive layer by sputtering copper. In this case, the chromium layer 12 is continuously formed in the stage before the copper layer 13 is formed, in consideration of the adhesion between the photosensitive glass and the conductive layer.

Meanwhile, in the second embodiment, the chromium layer 21 is formed as the underlayer by sputtering chromium, and the ITO layer 22 is formed as the conductive layer by sputtering ITO having high adhesion to the photosensitive glass.

Of course, in the first embodiment as well, it is also acceptable that the ITO layer is formed as the conductive layer by sputtering ITO. Thus, the step of forming the chromium layer 12 can be omitted in the stage before the copper layer 13 is formed, and therefore the manufacturing step can be shortened.

As described above, when the ITO layer is formed as the conductive layer by sputtering ITO, metal with low adhesion to the conductive layer may be used as the underlayer, and for example, nickel, tantalum, molybdenum silicon, aluminum, chromium nitride, etc., can be used, other than the chromium oxide formed by sputtering chromium and subjected to oxidation.

Further, any one of the metal having high adhesion to the substrate 100 being the photosensitive glass, can be used for the conductive layer such as ITO, and for example, metal such as titanium, tungsten, molybdenum, nickel/copper, electric silver plating, electric gold plating, and electric copper plating, etc., can be used.

<Regarding Etching Time for Selectively Etching the Underlayer>

In order to modify an etching time for etching the underlayer formed on the side wall 101a of the through hole 101 of the substrate 100, a substance having a higher etching rate than the conductive layer can be used, and according to the first embodiment, for example the chromium layer 11 as the chromium oxide layer with the main surface oxidized can be used as the underlayer, and the copper layer 13 can be used as the conductive layer. Even in this case, the etching time can be adjusted by varying the film thickness of the underlayer and the conductive layer.

For example, if the film thickness of the conductive layer is set to about twice the film thickness of the underlayer, the etching rate for the underlayer is indirectly high in either case of the manufacturing methods of the electron amplifier substrate of the first embodiment and the second embodiment, thus easily causing dynamic fractures of the underlayer and the conductive layer formed on the side wall 101a of the through hole 101 of the substrate 100.

A technical range of the present invention is not limited to the above-mentioned embodiment, and can be variously modified or improved in a range capable of deriving a specific effect obtained by constituting features of the invention and a combination thereof.

DESCRIPTION OF SIGNS AND NUMERALS

11 Chromium layer
12 Chromium layer
13 Copper layer
14 Electric copper plating layer
21 Chromium layer
22 ITO (indium tin oxide) layer
100 Substrate
101 Through hole
101a Side wall

The invention claimed is:

1. A manufacturing method of an electron amplifier substrate, which is the manufacturing method of a substrate used for a radiation detector that performs detection of a radiation by amplifying an electron in a gas, being an electron amplifier substrate with a conductive layer and a through hole formed thereon, the conductive layer having a layer adhered to a substrate main surface, the method comprising:
  forming an underlayer on a side wall, being an inner circumferential surface of the through hole, the underlayer having a surface where adhesion to the conductive layer is low;
  forming the conductive layer on the substrate main surface and on the surface of the underlayer formed on side wall of the through hole; and
  selectively etching the underlayer formed on the side wall of the through hole.

2. The method of claim 1, wherein the substrate is a photosensitive glass substrate, and the through hole is formed by irradiation of a ultraviolet ray.

3. The method of claim 1, wherein the substrate has front/back surfaces, and the conductive layer is formed on the front/back surfaces of the substrate.

4. The method of claim 1, wherein a plurality of through holes are formed, each of them having a circular shape in a plan view, and formed on the substrate at a specific interval.

5. The method of claim 1, wherein an etching time required for the etching step is set in a period until the conductive layer formed on the underlayer formed on the side wall of the through hole is fractured and then removed, together with the underlayer.

6. The method of claim 1, further comprising: oxidizing the surface of the underlayer, such that adhesion to the conductive layer is low, and an etching rate for a layer adhered to the conductive layer on the main surface of the substrate is high, wherein the underlayer is made of chromium.

7. The method of claim 1, wherein the conductive layer includes an adhesive layer adhered to the substrate, and a metal layer formed so as to cover the adhesive layer.

8. The method of claim 7, wherein the adhesive layer is made of chromium, and the metal layer is made of copper, and the adhesive layer and the metal layer are continuously formed.

9. A manufacturing method of an electron amplifier substrate, for manufacturing an electron amplifier substrate in which a conductive layer is formed having a layer adhered to a substrate made of a photosensitive glass, with a through hole formed by irradiation of ultraviolet rays, the method comprising:
  forming an underlayer composed of a chromium oxide layer with an oxidized surface, on a side wall of the through hole;
  forming a chromium layer on the side wall of the through hole on which the underlayer is formed, and on the substrate main surface, and forming a copper layer so as to cover the chromium layer continuously; and
  performing etching in an etching time set in a period until the conductive layer formed on the underlayer formed on the side wall of the through hole is fractured and removed together with the underlayer,
  wherein a plurality of through holes are formed, each of them having a circular shape in a plan view, and formed on the substrate at a specific interval.

10. A manufacturing method of an electron amplifier, wherein the electron amplifier substrate manufactured by the method of claim 1, is used.

11. A manufacturing method of a radiation detector, wherein the electron amplifier substrate manufactured by the method of claim 1, is used.

12. A manufacturing method of an electron amplifier, wherein the electron amplifier substrate manufactured by the method of claim 9, is used.

13. A manufacturing method of a radiation detector, wherein the electron amplifier substrate manufactured by the method of claim 9, is used.

14. A electron amplifier substrate manufactured by the method of claim 1.

15. A electron amplifier substrate manufactured by the method of claim 9.

* * * * *